(12) United States Patent
Zhao et al.

(10) Patent No.: US 12,040,593 B2
(45) Date of Patent: Jul. 16, 2024

(54) MULTI-WAVELENGTH LASER

(71) Applicant: Huawei Technologies Co., Ltd., Shenzhen (CN)

(72) Inventors: Jialin Zhao, Wuhan (CN); Chengcheng Gui, Wuhan (CN); Shengmeng Fu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 603 days.

(21) Appl. No.: 17/226,977

(22) Filed: Apr. 9, 2021

(65) Prior Publication Data

US 2021/0226418 A1 Jul. 22, 2021

Related U.S. Application Data

(63) Continuation of application No. PCT/CN2019/105301, filed on Sep. 11, 2019.

(30) Foreign Application Priority Data

Oct. 12, 2018 (CN) .......................... 201811190205.5

(51) Int. Cl.
*H01S 5/10* (2021.01)
*H01S 5/026* (2006.01)
(Continued)

(52) U.S. Cl.
CPC ............ *H01S 5/1092* (2013.01); *H01S 5/026* (2013.01); *H04B 10/503* (2013.01); *H04B 10/572* (2013.01)

(58) Field of Classification Search
CPC ...... H01S 5/1092; H01S 5/026; H01S 3/1304; H01S 3/1398; H01S 5/0085;
(Continued)

(56) References Cited

U.S. PATENT DOCUMENTS 3,453,559 A * 7/1969 Sharp .................... H01S 3/2316
372/98
6,430,336 B1 * 8/2002 Frankel ................ H04B 10/506
385/24
(Continued)

FOREIGN PATENT DOCUMENTS

CN 1251692 A 4/2000
CN 101128717 A 2/2008
(Continued)

OTHER PUBLICATIONS

Slavík et al., "Compact Optical Comb Generator Using InP Tunable Laser and Push-Pull Modulator," IEEE Photonics Technology Letters (vol. 27, Issue: 2, Jan. 15, 15, 2015), total 4 pages (Oct. 27, 2014).

(Continued)

*Primary Examiner* — Vu A Vu
(74) *Attorney, Agent, or Firm* — Leydig, Voit & Mayer, Ltd.

(57) ABSTRACT

A multi-wavelength laser is provided, including a reference wavelength-tunable laser, N−1 secondary wavelength-tunable lasers, N beam splitters, a phase modulator, and N−1 frequency difference detection apparatuses. The reference wavelength-tunable laser is connected to one beam splitter which includes two output ports, and one of the output ports is connected to the phase modulator. The phase modulator is separately connected to the N−1 frequency difference detection apparatuses. The N−1 secondary wavelength-tunable lasers one-to-one correspond to remaining N−1 beam splitters and the N−1 frequency difference detection apparatuses. The secondary wavelength-tunable laser is connected to a corresponding beam splitter, the corresponding beam splitter includes two output ports, and one of the output ports is connected to a corresponding frequency difference detection apparatus. N is a positive integer not less than 2. A multi- (Continued)

wavelength optical signal generated by the phase modulator has a precise frequency spacing.

20 Claims, 9 Drawing Sheets

(51) Int. Cl.
*H04B 10/50* (2013.01)
*H04B 10/572* (2013.01)

(58) Field of Classification Search
CPC .... H01S 5/06256; H01S 5/141; H01S 5/0687; H01S 5/4087; H01S 3/10053; H01S 3/01; H04B 10/503; H04B 10/572; H04B 10/506
USPC .......................................................... 372/20
See application file for complete search history.

(56) References Cited

U.S. PATENT DOCUMENTS

| | | | |
|---|---|---|---|
| 6,980,353 | B2 | 12/2005 | Watson et al. |
| 7,915,587 | B2* | 3/2011 | Federici ............. G02B 6/12004 250/341.1 |
| 7,986,413 | B2* | 7/2011 | Federici ................. G01J 3/453 356/485 |
| 7,995,630 | B2 | 8/2011 | Rakuljic |
| 8,520,306 | B2* | 8/2013 | Varnham ............... H01S 3/1307 359/279 |
| 9,124,371 | B2* | 9/2015 | McNicol ................. H04J 14/02 |
| 9,239,264 | B1* | 1/2016 | Demers ................... G01J 3/433 |
| 10,408,925 | B1* | 9/2019 | Manzur ................... G01S 17/10 |
| 10,578,494 | B1* | 3/2020 | Tiemann .................. G01J 9/02 |
| 2004/0114852 | A1 | 6/2004 | Brown |
| 2004/0213303 | A1 | 10/2004 | Litvin |
| 2011/0280581 | A1* | 11/2011 | Chann ..................... H01S 3/067 398/98 |

FOREIGN PATENT DOCUMENTS

| | | |
|---|---|---|
| CN | 101321019 A | 12/2008 |
| CN | 102608825 A | 7/2012 |
| CN | 102637995 A | 8/2012 |
| CN | 102771066 A | 11/2012 |
| CN | 103066494 A | 4/2013 |
| CN | 103067092 A | 4/2013 |
| CN | 103197439 A | 7/2013 |
| CN | 105589074 A | 5/2016 |
| CN | 106411413 A | 2/2017 |
| CN | 107113063 A | 8/2017 |
| CN | 107210818 A | 9/2017 |
| JP | 2003234722 A | 8/2003 |
| JP | 2007298765 A | 11/2007 |
| KR | 100914559 B1 | 9/2009 |

OTHER PUBLICATIONS

Morohashi et al., "Creation of Multi-Carrier Millimeter-Wave Signal Using Mach-Zehnder-Modulator-Based Flat Comb Generator," CLEO/Europe and EQEC 2011 Conference Digest OSA Technical Digest (CD) (Optical Society of America, 2011), total 1 page (2011).
Rahn et al., "DSP-Enabled Frequency Locking for Near-Nyquist Spectral Efficiency Superchannels utilizing Integrated Photonics," 2018 Optical Fiber Communications Conference and Exposition (OFC), Date of Conference: Mar. 11-15, 2018, total 3 pages.
Fujiwara et al., "Flattened optical multicarrier generation of 12.5 GHz spaced 256 channels based on sinusoidal amplitude and phase hybrid modulation," Electronics Letters, vol. 37 No. 15, total 1 page (Jul. 19, 2001).
Balakier et al., "Optical phase lock loop as high-Q filter for optical frequency comb lines selection," 2017 International Topical Meeting on Microwave Photonics (MWP), Date of Conference: Oct. 23-26, 2017, total 4 pages.
Foster et al., "Silicon-based monolithic optical frequency comb source," Optics Express vol. 19, No. 15, pp. 14233-14239 (2011), https://doi.org/10.1364/OE.19.014233 (Jul. 18, 2011).
Lu et al., "Ultra-narrow Linewidth Quantum Dot Coherent Comb Lasers," 2018 Optical Fiber Communications Conference and Exposition (OFC), Date of Conference: Mar. 11-15, 2018, total 3 pages.
Kuo et al., "Wideband Parametric Frequency Comb as Coherent Optical Carrier," Journal of Lightwave Technology, vol. 31, No. 21, total 6 pages (Nov. 1, 2013).
Kazovsky et al., "Experimental Relative Frequency Stabilization of a Set of Lasers Using Optical Phase-Locked Loops," IEEE Photonics Technology Letters, vol. 2, No. 7, Total 3pages, Institute of Electrical and Electronics Engineers, New York, New York (Jul. 1990).

\* cited by examiner

Multi-wavelength optical signal

MULTI-WAVELENGTH LASER

CROSS-REFERENCE TO RELATED APPLICATIONS

This application is a continuation of International Application No. PCT/CN2019/105301, filed on Sep. 11, 2019, which claims priority to Chinese Patent Application No. 201811190205.5, filed on Oct. 12, 2018. The disclosures of the aforementioned applications are hereby incorporated by reference in their entireties.

TECHNICAL FIELD

Embodiments of this application relate to the field of optical fiber communications technologies, and in particular, to a multi-wavelength tunable laser.

BACKGROUND

Currently, a wavelength-tunable laser is one of important optoelectronic devices in an optical fiber communications system. The wavelength-tunable laser can be used as a light source at a transmit end and a local oscillator laser at a coherent receive end. As requirements for a system transmission capacity increase, a single-wavelength transmission capacity can be increased to 100 Gbit/s, 200 Gbit/s, 400 Gbit/s, or higher by increasing a baud rate and a modulation order of a transmitted signal. However, the increase of the baud rate and the modulation order limits performance of single-wavelength large-capacity transmission and reduces a transmission distance. Multi-channel parallel transmission can reduce a single-wavelength rate and increase the transmission distance while improving a transmission capacity. Therefore, multi-channel parallel transmission is a key technology for implementing over 400 Gbit/s ultra-large-capacity and long-haul transmission.

In a long-haul coherent communications system, a single-wavelength tunable laser needs to have features such as high output power, a narrow linewidth, a high side mode suppression ratio (SMSR), and a high optical signal-to-noise ratio (OSNR). An ultra-large-capacity coherent multi-channel parallel transmission system requires a multi-wavelength light source. In addition to having same performance as a single wavelength light source, the multi-wavelength light source further needs to provide a precise frequency spacing and a frequency spacing tuning function. For example, a frequency spacing output by the multi-wavelength light source may be set to 37.5 GHz, 50 GHz, or 75 GHz. The frequency spacing can be selected and may be fine-tuned within a specific frequency range.

FIG. 1 shows an existing multi-wavelength light source technology. A plurality of tunable laser arrays are monolithically integrated, and then a shared wavelength locking apparatus is used to lock a frequency of each tunable laser. However, in this solution, frequency offset precision is low, and only frequency offset precision less than 100 MHz can be implemented. Therefore, this solution is not applicable to a scenario in which higher frequency offset precision is required.

SUMMARY

An objective of this application is to provide a multi-wavelength laser, to resolve a problem that frequency offset precision of an existing multi-wavelength light source is relatively low and an application scenario is limited.

According to a first aspect, a multi-wavelength laser is provided, including N wavelength-tunable lasers, N beam splitters, a phase modulator, and N−1 frequency difference detection apparatuses, where N is a positive integer not less than 2. A first wavelength-tunable laser is configured to: generate a first laser signal, and send the first laser signal to a first beam splitter in the N beam splitters, where the N wavelength-tunable lasers include the first wavelength-tunable laser. The first beam splitter is configured to: split the first laser signal into at least two beams of first laser signals, and send a first beam of first laser signal to the phase modulator, where a second beam of first laser signal is an output signal of the multi-wavelength laser. The phase modulator is configured to: modulate the first beam of first laser signal to generate a multi-wavelength optical signal, and send the multi-wavelength optical signal to a first frequency difference detection apparatus, where the N−1 frequency difference detection apparatuses include the first frequency difference detection apparatus. Frequency spacings between adjacent wavelengths in the multi-wavelength optical signal are the same. A second wavelength-tunable laser is configured to: generate a second laser signal, and send the second laser signal to a second beam splitter in the N beam splitters, where the N wavelength-tunable lasers include the second wavelength-tunable laser. The second beam splitter is configured to: split the second laser signal into at least two beams of second laser signals, and send a first beam of second laser signal to the first frequency difference detection apparatus, where a second beam of second laser signal is another output signal of the multi-wavelength laser. The first frequency difference detection apparatus is configured to: obtain a first control signal based on the multi-wavelength optical signal and the first beam of second laser signal, and send the first control signal to the second wavelength-tunable laser, where the first control signal is used to tune an output wavelength of the second wavelength-tunable laser, so that an actual frequency spacing between the second laser signal and the first laser signal is equal to a target frequency spacing between the second laser signal and the first laser signal.

According to a second aspect, a frequency control method for a multi-wavelength laser is provided. The multi-wavelength laser includes N wavelength-tunable lasers, N beam splitters, a phase modulator, and N−1 frequency difference detection apparatuses, and the N wavelength-tunable lasers include a reference wavelength-tunable laser and N−1 secondary wavelength-tunable lasers. The reference wavelength-tunable laser is connected to one beam splitter, the beam splitter includes a first output port and a second output port, the first output port is used as an output port of the multi-wavelength laser, and the second output port is connected to the phase modulator. The phase modulator is separately connected to the N−1 frequency difference detection apparatuses. The N−1 secondary wavelength-tunable lasers one-to-one correspond to remaining N−1 beam splitters and the N−1 frequency difference detection apparatuses. The secondary wavelength-tunable laser is connected to a corresponding beam splitter, and the corresponding beam splitter includes a third output port and a fourth output port. The third output port is used as an output port of the multi-wavelength laser, and the fourth output port is connected to a corresponding frequency difference detection apparatus. N is a positive integer not less than 2. The frequency control method includes:

sending a part of a first laser signal output by a first wavelength-tunable laser to the phase modulator to generate a multi-wavelength optical signal, where a center frequency of the multi-wavelength optical signal is an output frequency of the first wavelength-tunable laser, and a frequency spacing of the multi-wavelength optical signal is a frequency of a drive signal of the phase modulator; sending a part of a laser signal output by the secondary wavelength-tunable laser and the multi-wavelength optical signal to the frequency difference detection apparatus to generate a control signal corresponding to the secondary wavelength-tunable laser, where a difference between a target frequency of the secondary wavelength-tunable laser and a frequency of a corresponding subcarrier in the multi-wavelength optical signal is less than a difference between the target frequency and a frequency of another subcarrier in the multi-wavelength optical signal, and a difference between an initial frequency configured for the secondary wavelength-tunable laser and the frequency of the corresponding subcarrier is less than a difference between the initial frequency and the frequency of the another subcarrier in the multi-wavelength optical signal; and changing an output frequency of the wavelength-tunable laser by using the control signal, so that actual frequency spacings between laser signals output by the N wavelength-tunable lasers are equal to a target frequency spacing.

DESCRIPTION OF EMBODIMENTS

The following describes the technical solutions in the embodiments of this application with reference to the accompanying drawings in the embodiments of this application.

Figure 1:
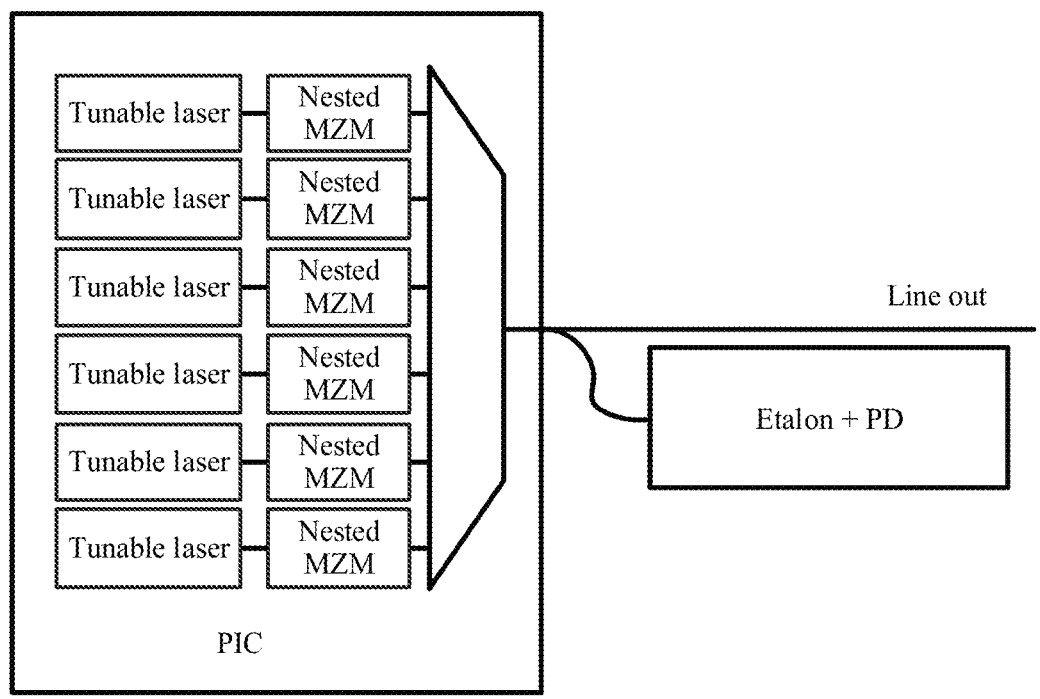
FIG. 1 is a structural diagram of a multi-wavelength laser in the prior art.
Figure 2:
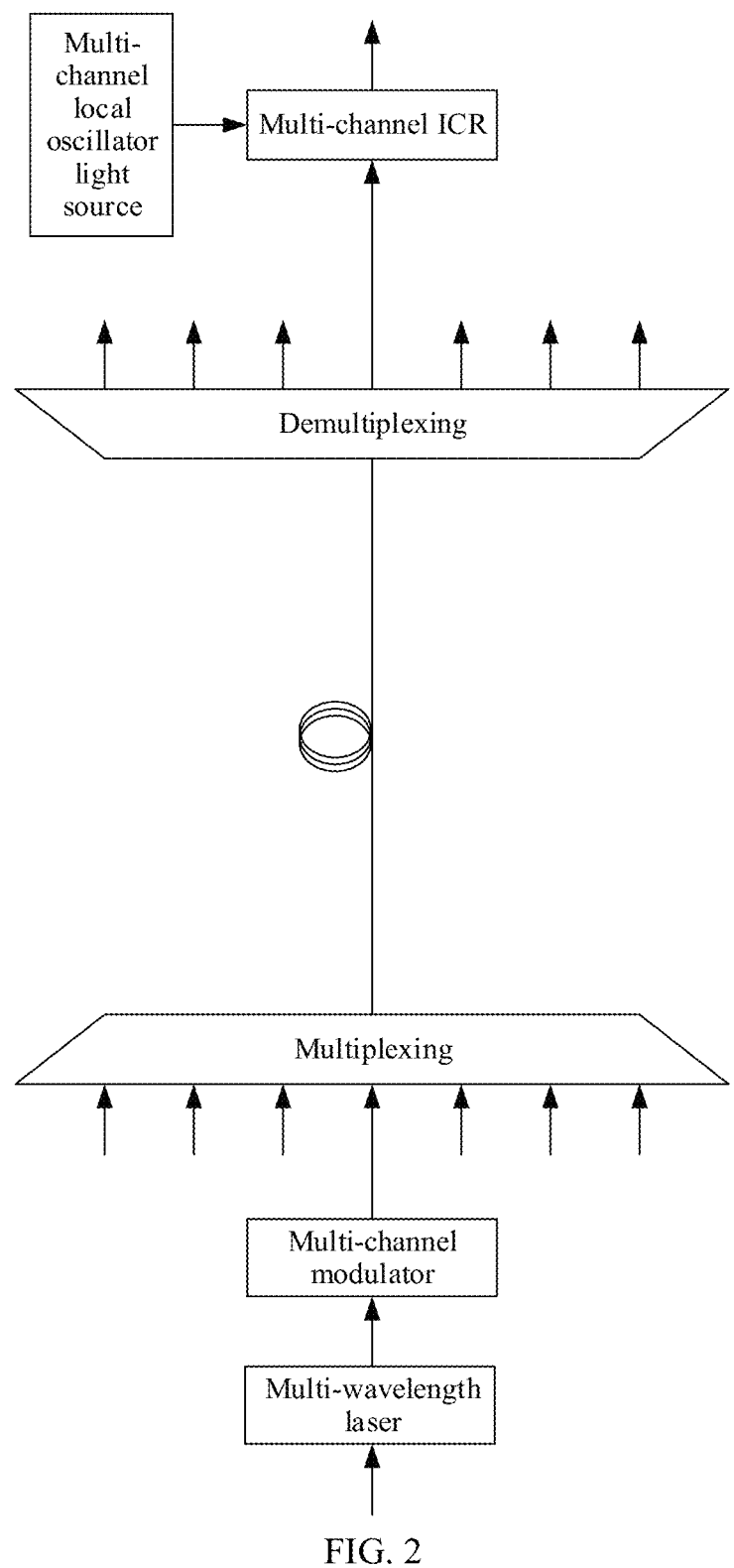
FIG. 2 is a schematic diagram of a multi-channel parallel transmission system.

A multi-wavelength laser provided in the embodiments of this application may be applied to an optical communications system in which lasers of a plurality of wavelengths are needed, for example, a multi-channel parallel transmission system or a dense wavelength division multiplexing (DWDM) system. FIG. 2 is a schematic diagram of a multi-channel parallel transmission system. Optical devices at a transmit end include a multi-wavelength laser and a multi-channel modulator. A frequency spacing of the multi-wavelength laser is precisely set. Each channel of laser light is loaded with amplitude and phase modulation signals by using a modulator, coupled by using a wavelength division multiplexer, and then transmitted to a transmission optical fiber. After demultiplexing at a receive end, a modulated optical signal loaded on the multi-wavelength laser and an optical signal emitted by a multi-channel local oscillator light source jointly enter a multi-channel integrated coherent receiver (ICR) for processing at the receive end. A multi-channel joint processing algorithm can be used to reduce a non-linear penalty of an optical signal transmitted in a light ray and improve receiving performance. In the multi-channel parallel transmission system, a frequency spacing between multi-wavelength laser signals may be further reduced to reduce a filtering penalty, and then an algorithm is used to compensate for impact caused by crosstalk between wavelengths, to implement higher spectrum utilization and better performance.

Figure 3:
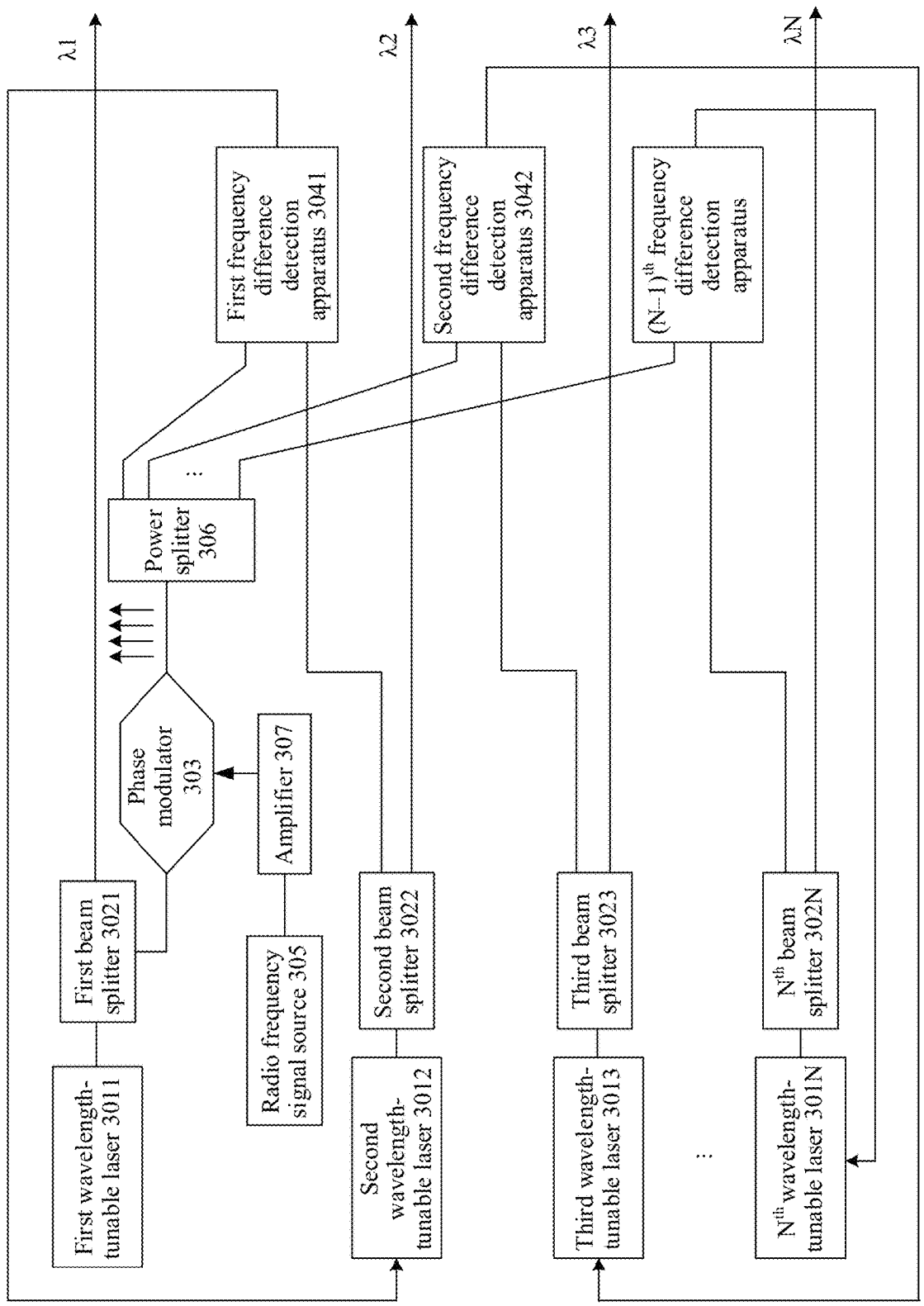
FIG. 3 is a structural diagram of a multi-wavelength laser according to an embodiment of this application.

The following describes in detail a multi-wavelength laser 300 according to this application with reference to FIG. 3. FIG. 3 is a schematic block diagram of the multi-wavelength laser 300 according to an embodiment of this application.

The multi-wavelength laser 300 includes N wavelength-tunable lasers 301, N beam splitters 302, a phase modulator 303, and N−1 frequency difference detection apparatuses 304. N is a positive integer not less than 2, and the N wavelength-tunable lasers 301 include a first wavelength-tunable laser and a second wavelength-tunable laser.

The first wavelength-tunable laser 3011 is configured to: generate a first laser signal, and send the first laser signal to a first beam splitter 3021 in the N beam splitters.

The first beam splitter 3021 is configured to: split the first laser signal into at least two beams of first laser signals, and send a first beam of first laser signal to the phase modulator 303, where a second beam of first laser signal is an output signal of the multi-wavelength laser 300. A split ratio of the first beam splitter may be 90:10 or another value, and a beam of laser light with high power is usually used as output light of the multi-wavelength laser. Beam splitters mentioned below may all use different split ratios such as 90:10 and 80:20.

The phase modulator 303 is configured to: modulate the first beam of first laser signal to generate a multi-wavelength optical signal, and send the multi-wavelength optical signal to a first frequency difference detection apparatus 3041, where the N−1 frequency difference detection apparatuses include the first frequency difference detection apparatus, and frequency spacings between adjacent wavelengths in the multi-wavelength optical signal are the same.

Optionally, the multi-wavelength laser 300 further includes a radio frequency signal source 305, configured to: generate a radio frequency signal, and send the radio frequency signal to the phase modulator 303. The phase modulator 303 is configured to modulate the first beam of first laser signal based on the radio frequency signal to generate the multi-wavelength optical signal, where the frequency spacings between the adjacent wavelengths in the multi-wavelength optical signal are related to a frequency of the radio frequency signal. Specifically, the radio frequency signal is applied to the phase modulator 303, to generate the multi-wavelength optical signal with a precise frequency spacing. The frequency of the radio frequency signal is the same as the frequency spacings between the adjacent wavelengths in the multi-wavelength optical signal. In this way, the frequency spacings between the adjacent wavelengths in the generated multi-wavelength optical signal may be changed by changing the frequency of the radio frequency signal. Further, the multi-wavelength laser 300 further includes an amplifier 307. Located between the radio frequency signal source 305 and the phase modulator 303, the amplifier 307 is configured to: amplify the radio frequency signal, and then send the amplified radio frequency signal to the phase modulator 303, to avoid insufficient power of the radio frequency signal.

The second wavelength-tunable laser 3012 is configured to: generate a second laser signal, and send the second laser signal to a second beam splitter 3022 in the N beam splitters.

The second beam splitter 3022 is configured to: split the second laser signal into at least two beams of second laser signals, and send a first beam of second laser signal to the first frequency difference detection apparatus 3041, where a second beam of second laser signal is another output signal of the multi-wavelength laser 300.

The first frequency difference detection apparatus 3041 is configured to: obtain a first control signal based on the multi-wavelength optical signal and the first beam of second laser signal, and send the first control signal to the second wavelength-tunable laser 3012, where the first control signal is used to tune an output wavelength of the second wavelength-tunable laser, so that an actual frequency spacing between the second laser signal and the first laser signal is equal to a target frequency spacing between the second laser signal and the first laser signal.

In an actual application of the multi-wavelength laser, an output laser signal of each wavelength-tunable laser is initially set based on a target frequency spacing. Because frequency precision of the wavelength-tunable laser is limited, there is a deviation between actual output wavelengths of the plurality of wavelength-tunable lasers. In this embodiment, due to precision of the wavelength-tunable laser, before the second wavelength-tunable laser receives the first control signal, the actual frequency spacing between the first laser signal and the second laser signal differs from the target frequency spacing between the first laser signal and the second laser signal.

Figure 4:
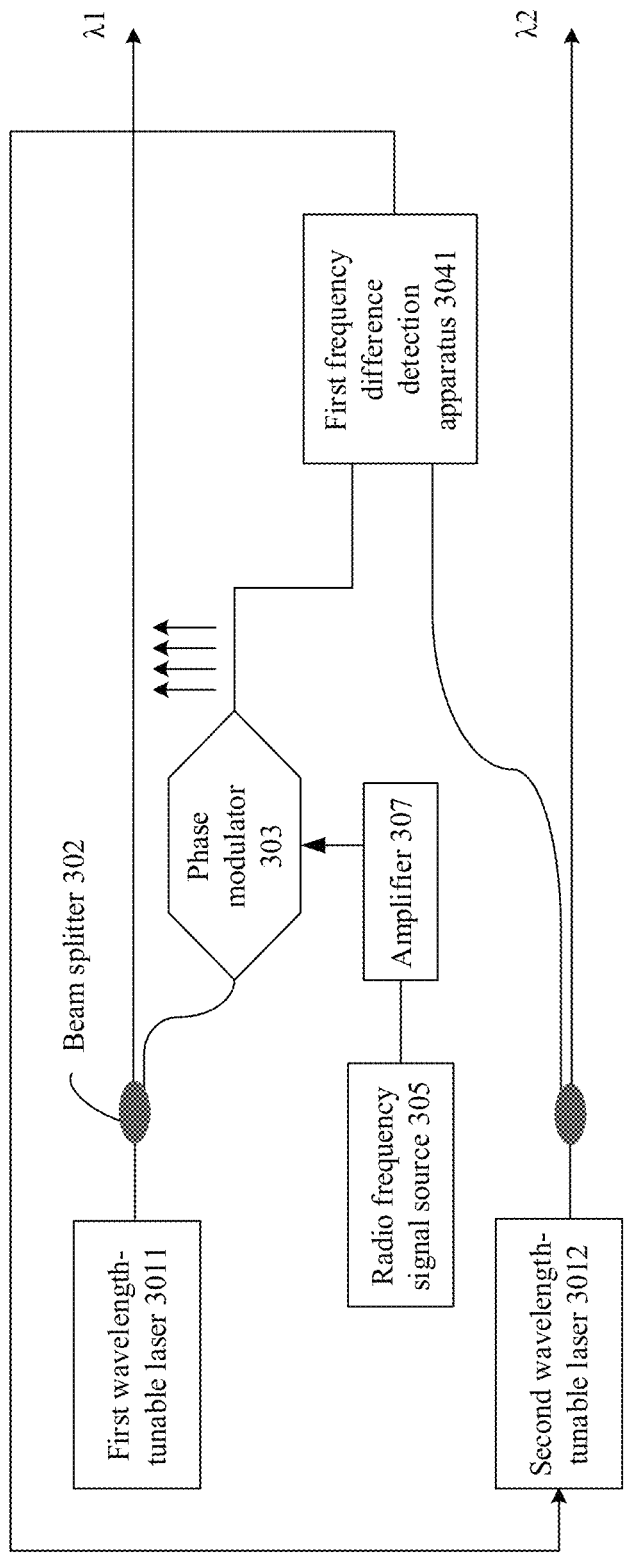
FIG. 4 is a structural diagram of a multi-wavelength laser according to another embodiment of this application.

Optionally, when N=2, the phase modulator 303 may be directly connected to the first frequency difference detection apparatus 3041, and directly send the multi-wavelength optical signal to the first frequency difference detection apparatus 3041. In this case, a structure of the multi-wavelength laser 300 is shown in FIG. 4.

Optionally, when N is greater than 2, the N wavelength-tunable lasers include a third wavelength-tunable laser 3013, and the N−1 frequency difference detection apparatuses 304 include a second frequency difference detection apparatus 3042. In this case, the multi-wavelength laser 300 further includes a power splitter 306, and a specific structure of the multi-wavelength laser 300 is still shown in FIG. 3.

The phase modulator 303 sends the multi-wavelength optical signal to the power splitter 306. The power splitter 306 splits the multi-wavelength optical signal into at least N−1 multi-wavelength optical signals, sends a first multi-wavelength optical signal to the first frequency difference detection apparatus 3041, and sends a second multi-wavelength optical signal to the second frequency difference detection apparatus 3042. It should be understood that the power splitter is configured to split one signal into a plurality of signals based on power, and wavelength information of each of the plurality of signals is consistent with that of the signal received by the power splitter.

The third wavelength-tunable laser 3013 is configured to: generate a third laser signal, and send the third laser signal to a third beam splitter 3023 in the N beam splitters. The third beam splitter 3023 is configured to: split the third laser signal into at least two beams of third laser signals, and send a first beam of third laser signal to the second frequency difference detection apparatus 3042, where a second beam of third laser signal is an output signal of the multi-wavelength laser 300.

The second frequency difference detection apparatus 3042 is configured to: obtain a second control signal based on the second multi-wavelength optical signal and the first beam of third laser signal, and send the second control signal to the third wavelength-tunable laser 3013, where the second control signal is used to tune an output wavelength of the third wavelength-tunable laser 3013, so that an actual frequency spacing between the third laser signal and the first laser signal is equal to a target frequency spacing between the third laser signal and the first laser signal. It should be understood that before the third wavelength-tunable laser receives the second control signal, the actual frequency spacing between the first laser signal and the third laser signal also differs from the target frequency spacing between the first laser signal and the third laser signal.

It should be noted that, when N is equal to 4, the multi-wavelength laser in this embodiment of this application may further include a fourth wavelength-tunable laser, a fourth beam splitter, and a third frequency difference detection apparatus; when N=5, the multi-wavelength laser may further include a fifth wavelength-tunable laser, a fifth beam splitter, and a fourth frequency difference detection apparatus. A value of N depends on an actual situation, and is not limited in this embodiment of this application.

Currently, frequency precision of a commercial single-channel wavelength-tunable laser is about +1.5 GHz. In other words, assuming that a target frequency spacing between the first wavelength-tunable laser and the second wavelength-tunable laser is 25 GHz, f1 and f2 are initially set for the first wavelength-tunable laser and the second wavelength-tunable laser based on the frequency spacing respectively. However, in practice, a possible frequency range of the first wavelength-tunable laser is f1±1.5 GHz, and a possible frequency range of the second wavelength-tunable laser is f2±1.5 GHz. An actual frequency spacing between the first wavelength-tunable laser and the second wavelength-tunable laser may be any value from 22 GHz to 28 GHz, and an error reaches 3 GHz. This is unacceptable for the multi-wavelength laser. In the multi-wavelength laser 300 disclosed in this embodiment of this application, the multi-wavelength optical signal with the precise frequency spacing and generated by the phase modulator is used as a reference. In this way, frequency spacings between the plurality of wavelength-tunable lasers can be calibrated, and a frequency spacing error is reduced.

Figure 5:
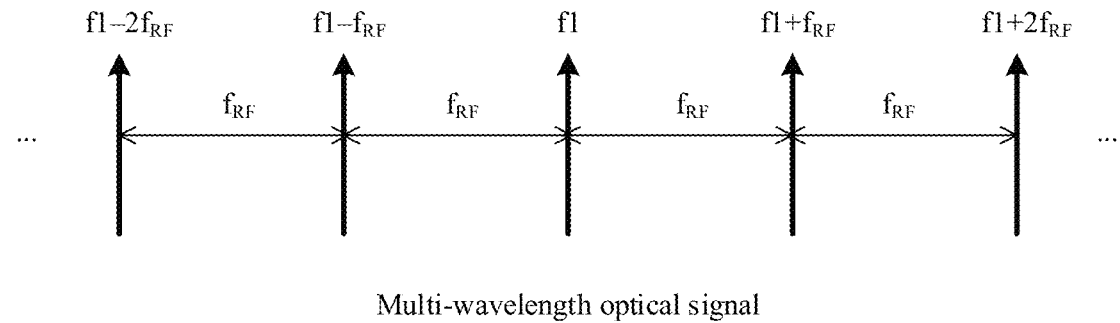
FIG. 5 is a schematic diagram of a multi-wavelength optical signal generated by a phase modulator.

Specifically, it is assumed that a frequency of the first laser signal output by the first wavelength-tunable laser is f1, and target frequency spacings between laser signals with adjacent wavelengths in laser signals output by the multi-wavelength laser are all F. The phase modulator modulates the first laser signal. Therefore, the multi-wavelength optical signal generated by the phase modulator uses f1 as a center frequency, and a center frequency of each subcarrier is $f1+k*f_{RF}$, as shown in FIG. 5, where $f_{RF}$ is a frequency of a drive signal of the phase modulator, and k is an integer. If k is a negative value, it indicates that the subcarrier is located on a low frequency side of f1; or if k is a positive value, it indicates that the subcarrier is located on a high frequency side of f1.

It is assumed that the target frequency spacing F between the second laser signal and the first laser signal is the same as or close to $f_{RF}$, and a target frequency of the second laser signal is f1+F. After initial setting, a frequency f2 of the second laser signal is set to be near f1+$f_{RF}$. Because the frequency precision of the wavelength-tunable laser is limited, even if a theoretical value of f2 is set to f1+$f_{RF}$, there is a deviation between an actual value of f2 and f1+$f_{RF}$, in other words, there is a deviation between an actual frequency spacing between f2 and f1, and a target frequency spacing between f2 and f1. After receiving the second laser signal and the multi-wavelength optical signal, the first frequency difference detection apparatus obtains a frequency difference between the frequency of the second laser signal and f1+$f_{RF}$. The first frequency difference detection apparatus further receives a reference signal, and tunes the second wavelength-tunable laser based on a difference between the frequency difference and a frequency of the reference signal to make the output wavelength of the second wavelength-tunable laser be the same as f1+F. This ensures that the actual frequency spacing between f2 and f1 is equal to the target frequency spacing between f2 and f1. If a value of $f_{RF}$ is the same as that of F, f2 can be the same as the target frequency only when the frequency difference is tuned to 0. In this case, the frequency of the reference signal may be set to be close to 0, for example, 1 MHz to 10 MHz, and the output wavelength of the second wavelength-tunable laser is tuned until the difference between the frequency difference and the frequency of the reference signal is 0. If the value of $f_{RF}$ is different from that of F, for example, the difference is 1 GHz, f2 can be the same as the target frequency only when the frequency difference is tuned to 1 GHz, in other words, the frequency of the reference signal may be set to 1 GHz.

It should be understood that, that the value of F is close to the value of $f_{RF}$ may be understood as that a frequency difference between F and $f_{RF}$ is less than a frequency difference between F and k*$f_{RF}$ (k≠1), and such an understanding is applicable to the following description that frequencies are close to each other. That f2 is set to be near f1+$f_{RF}$ may be understood as that a frequency difference between f2 and f1+f& is less than a frequency difference between f2 and f1+k*$f_{RF}$ (k≠1), and such an understanding is applicable to the following description about setting a frequency of a laser signal to be near a given frequency.

It is assumed that the target frequency spacing between the third laser signal and the first laser signal is 2F, and a frequency f3 of the third laser signal is located on the low frequency side of f1. After initial setting, f3 is set to be near f1-2*$f_{RF}$. After receiving the third laser signal and the multi-wavelength optical signal, the second frequency difference detection apparatus obtains a frequency difference between the third laser signal and f1-2*$f_{RF}$. The second frequency difference detection apparatus further receives a reference signal, and tunes the third wavelength-tunable laser based on a difference between the frequency difference and the frequency of the reference signal to make the output wavelength of the third wavelength-tunable laser be the same as f1-2F. This ensures that an actual frequency spacing between f3 and f1 is equal to a target frequency spacing between f3 and f1. Likewise, if the value of $f_{RF}$ is set to be the same as that of F, f3 can be the same as a target frequency only when the frequency difference is tuned to 0, in other words, the frequency of the reference signal may be set to be close to 0, for example, 1 MHz to 10 MHz. If the value of $f_{RF}$ is different from that of F, for example, the difference is 1 GHz, there is a difference of 2 GHz between f1-2*$f_{RF}$ and f1-2F, and f3 can be the same as the target frequency only when the frequency difference is tuned to 2 GHz, in other words, the frequency of the reference signal may be set to 2 GHz. The output wavelength of the second wavelength-tunable laser is tuned until the difference between the frequency difference and the frequency of the reference signal is 0. By analogy, it can be ensured that, in the laser signals output by the multi-wavelength laser, an actual frequency spacing between different laser signals is equal to their target frequency spacing.

The multi-wavelength optical signal generated by the phase modulator has the precise frequency spacing. Therefore, in the laser signals output by the multi-wavelength laser disclosed in this embodiment of this application, there is a very small deviation between an actual frequency spacing between different laser signals, and their target frequency spacing. A laser signal output by the multi-wavelength laser is directly from a wavelength-tunable laser. Therefore, the laser signal output by the multi-wavelength laser has same features such as high output power, a narrow linewidth, a high SMSR, and a high OSNR as the single wavelength-tunable laser.

It should be understood that, in the laser signals output by the multi-wavelength laser, a laser signal whose wavelength is adjacent to a wavelength of the first laser signal is a laser signal that has a minimum frequency difference from the first laser signal on the high frequency side or the low frequency side of the first laser signal. For example, the multi-wavelength laser includes four output signals. It is assumed that frequencies of the first laser signal, the second laser signal, the third laser signal, and a fourth laser signal are 50 GHz, 75 GHz, 25 GHz, and 100 GHz respectively. In this case, the wavelength of the first laser signal is adjacent to a wavelength of the second laser signal and a wavelength of the third laser signal, the wavelength of the second laser signal is adjacent to the wavelength of the first laser signal and a wavelength of the fourth laser signal, the wavelength of the third laser signal is adjacent to the wavelength of the first laser signal, and the wavelength of the fourth laser signal is adjacent to the wavelength of the second laser signal.

Further, when the target frequency spacing F is relatively large, the value of $f_{RF}$ may be set to 1/n of F, where n is a positive integer. For example, when F is 75 GHz, $f_{RF}$ may be set to 25 GHz or 37.5 GHz; when F is 100 GHz, $f_{RF}$ may be set to 25 GHz or 50 GHz. Alternatively, $f_{FR}$ may be set to a frequency that has a difference from 1/n of F. For example, when F is 75 GHz, $f_{RF}$ may be set to 24.5 GHz or 37 GHz; when F is 100 GHz, $f_{RF}$ may be set to 25.5 GHz or 50.5 GHz.

For example, F is 75 GHz, and $f_{RF}$ is 24.5 GHz. It is assumed that the frequency f2 of the second laser signal is located on the high frequency side of the frequency f1 of the first laser signal, and in the laser signals output by the multi-wavelength laser, the wavelength of the second laser signal is adjacent to the wavelength of the first laser signal. After initial setting, f2 is set to be near f1+3*$f_{RF}$. Because the frequency precision of the wavelength-tunable laser is limited, there is a deviation between f2 and f1+3*$f_{RF}$, in other words, there is a deviation between the actual frequency spacing between f2 and f1, and the target frequency spacing between f2 and f1. After receiving the second laser signal and the multi-wavelength optical signal, the first frequency difference detection apparatus obtains a frequency difference between the second laser signal and f1+3*$f_{RF}$. The first frequency difference detection apparatus further receives the reference signal, and tunes the second wavelength-tunable laser based on a difference between the frequency difference and the reference signal to make the output wavelength of the second wavelength-tunable laser be the same as f1+3*$f_{RF}$. This ensures that the actual frequency spacing between f2 and f1 is equal to the target frequency spacing between f2 and f1. Because F=3$f_{FR}$+1.5 GHz, there is a difference of 1.5 GHz between f1+3*$f_{RF}$ and a target value of f2. Therefore, the frequency difference needs to be tuned to 1.5 GHz, in other words, the frequency of the reference signal may be set to 1.5 GHz. Likewise, it is assumed that the frequency f3 of the third laser signal is on a high frequency side of f2, and in the laser signals output by the multi-wavelength laser, the wavelength of the third laser signal is adjacent to the wavelength of the second laser signal. After initial setting, f3 is set to be near f1+6*$f_{RF}$. After receiving the third laser signal and the multi-wavelength optical signal, the second frequency difference detection apparatus obtains a frequency difference between the third laser signal and f1+6*$f_{RF}$. The second frequency difference detection apparatus further receives the reference signal. Because a target value of f3 is f1+2F, namely, f1+6*$f_{RF}$+3 GHz, the frequency of the reference signal needs to be set to 3 GHz. The third wavelength-tunable laser is tuned based on a difference between the frequency difference and the frequency of the reference signal to make the output wavelength of the third wavelength-tunable laser be the same as f1+2F. This ensures that an actual frequency spacing between f3 and f2 is equal to a target frequency spacing between f3 and f2.

In the foregoing manner, the multi-wavelength laser disclosed in this embodiment of this application can output a multi-wavelength laser signal with a larger frequency spacing, and a phase modulator with large bandwidth is not required. In this way, implementation is easier.

It should be understood that all the foregoing embodiments are described by using an example in which the target frequency spacings are the same. The technical solutions of this application further include a case in which target frequency spacings between different laser signals are different. For example, the multi-wavelength laser output three laser signals. The frequency f2 of the second laser signal is located on the high frequency side of the frequency f1 of the first laser signal, and the target frequency spacing between f2 and f1 is 25 GHz; the frequency f3 of the third laser signal is located on the low frequency side of f1, and the target frequency spacing between f3 and f1 is 50 GHz; and the frequency $f_{RF}$ of the drive signal of the phase modulator is set to 25 GHz. In this case, during initial setting, f2 is set to be near f1+$f_{RF}$, and f3 is set to be near f1-2*$f_{RF}$. Remaining steps are consistent with those in the foregoing embodiments, and details are not described again.

Figure 6:
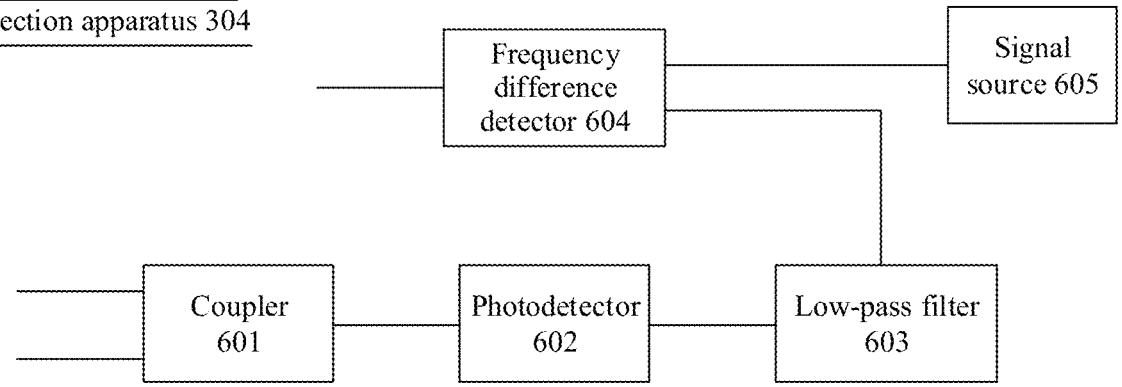
FIG. 6 is a structural diagram of a frequency difference detection apparatus in a multi-wavelength laser according to another embodiment of this application.

Optionally, in the embodiments shown in FIG. 3 and FIG. 4, the frequency difference detection apparatus 304 includes a coupler 601, a photodetector 602, a low-pass filter 603, a frequency difference detector 604, and a signal source 605. A specific connection relationship is shown in FIG. 6.

The coupler 601 is configured to: receive the multi-wavelength optical signal and a laser signal, perform interference on the multi-wavelength optical signal and the laser signal, and send an optical signal obtained through interference to the photodetector 602. The photodetector 602 is configured to: perform optical-to-electrical conversion on the optical signal obtained through interference, and send a converted interference signal to the low-pass filter 603. The low-pass filter 603 is configured to: perform low-pass filtering on the converted interference signal, and send a filtered interference signal to the frequency difference detector 604. The signal source 605 is configured to: generate the reference signal, and send the reference signal to the frequency difference detector 604. The frequency difference detector 604 is configured to: obtain the reference signal, detect a frequency difference between the filtered interference signal and the reference signal to obtain a control signal, and send the control signal. Optionally, the frequency difference detection apparatus 304 further includes an amplifier 606, configured to receive the filtered interference signal, amplify the signal, and send the amplified signal to the frequency difference detector 604.

Figure 7:
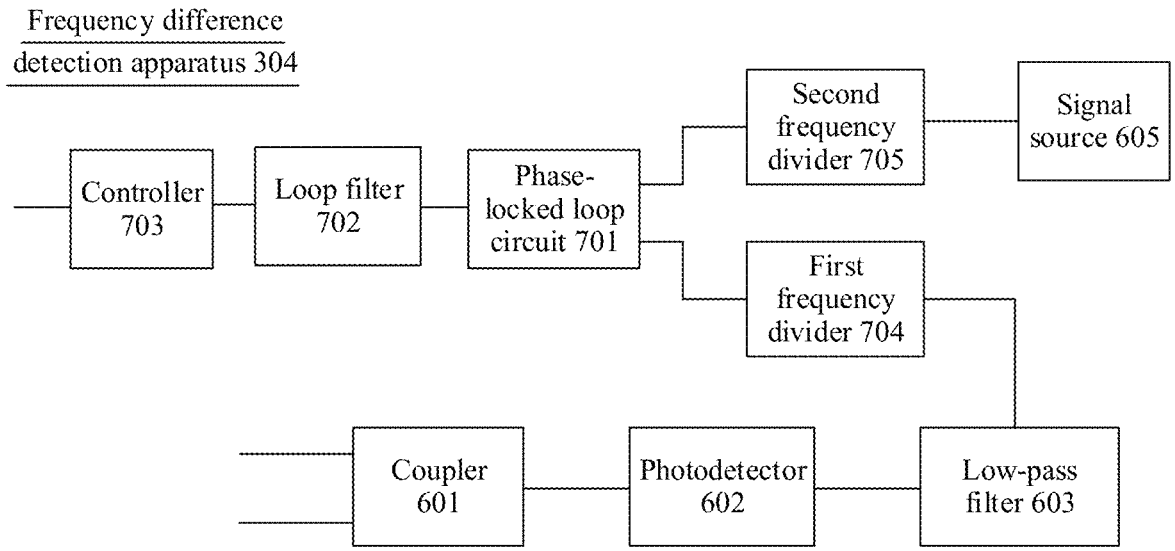
FIG. 7 is a structural diagram of a frequency difference detector in a frequency difference detection apparatus according to another embodiment of this application.

Optionally, the frequency difference detector 604 includes a phase-locked loop circuit 701, a loop filter 702, and a controller 703, as shown in FIG. 7. The phase-locked loop circuit 701 is configured to: detect the frequency difference between the filtered interference signal and the reference signal to obtain a frequency difference signal, and send the frequency difference signal to the loop filter 702. The loop filter 702 is configured to: add a loop gain to the frequency difference signal and filter the frequency difference signal, and then send an obtained frequency difference signal to the controller 703. The controller 703 is configured to: generate the control signal based on the received signal, and send the control signal.

The following uses a four-wavelength laser as an example to describe in detail a function of the frequency difference detection apparatus. It is assumed that a frequency of a first laser signal is f1, and target frequency spacings between laser signals with adjacent wavelengths in laser signals output by the multi-wavelength laser are all F. A phase modulator modulates the first laser signal. Therefore, a multi-wavelength optical signal generated by the phase modulator uses f1 as a center frequency, and a center frequency of each subcarrier is f1+k*$f_{RF}$, as shown in FIG. 5, where $f_{RF}$ is a frequency of a drive signal of the phase modulator, and k is an integer. If k is a negative value, it indicates that the subcarrier is located on a low frequency side of f1; or if k is a positive value, it indicates that the subcarrier is located on a high frequency side of f1.

It is assumed that a value of F is the same as or close to a value of f&, a frequency f2 of a second laser signal is set to be near f1-$f_{RF}$, a frequency f3 of a third laser signal is set to be near f1+$f_{RF}$, and a frequency f4 of a fourth laser signal is set to be near f1+2$f_{RF}$. Because frequency precision of a wavelength-tunable laser is limited, there is a deviation Δf1 between f2 and f1-$f_{RF}$, where |Δf1|=|f2-(f1-$f_{RF}$)|.

When the multi-wavelength optical signal and the second laser signal are input into a coupler of a first frequency difference detection apparatus, the two signals interfere with each other on the coupler, to obtain an optical signal obtained through interference. The optical signal obtained through interference also includes a plurality of subcarriers with different frequencies. A frequency of each subcarrier in the optical signal obtained through interference is a modulus value of a difference between the frequency f2 of the second laser signal and a frequency of each subcarrier in the multi-wavelength optical signal. Therefore, in the subcarriers in the optical signal obtained through interference, a lowest frequency is |Δf1|=|f2-(f1-$f_{RF}$)|. Frequencies of other subcarriers excluding a subcarrier with the lowest frequency are |Δf1±a*$f_{RF}$|, where a is a positive integer. Then, a photodetector performs optical-to-electrical conversion on the optical signal obtained through interference, and sends a converted interference signal to a low-pass filter. All the subcarriers excluding the subcarrier whose frequency is $|\Delta f1|$ in the interference signal can be filtered out by properly setting bandwidth of the low-pass filter, in other words, a filtered interference signal is converted into an electrical signal whose frequency is $|\Delta f1|$. Then, a phase-locked loop circuit processes the filtered interference signal and a reference signal to obtain a frequency difference signal, and sends the frequency difference signal to a controller. The controller tunes a wavelength of a laser signal output by a second wavelength-tunable laser until a frequency of the filtered interference signal is the same as a frequency of the reference signal.

The frequency $f_{ref}$ of the reference signal is related to the target frequency spacing F. It is assumed that a target frequency spacing between a laser signal and the first laser signal is Fn, a frequency spacing between subcarriers in the multi-wavelength optical signal is $f_{RF}$, and a difference between Fn and $b*f_{RF}$ is less than a difference between Fn and another multiple of $f_{RF}$. In this case, a frequency of a reference signal of a frequency difference detection apparatus corresponding to the laser signal is the difference between Fn and $b*f_{RF}$, where b is a positive integer.

For the first frequency difference detection apparatus, a target frequency of f2 is f1-F. If f2 has been tuned to the target frequency, the deviation between f2 and f1-$f_{RF}$ inevitably satisfies the following relationship: $\Delta f1|=|(f1-F)-(f1-f_{RF})|=|f_{RF}-F|$. Conversely, f2 can be tuned to the target frequency only when this relationship is satisfied. Therefore, the frequency $f_{ref}$ of the reference signal needs to be set to $|f_{RF}-F|$, and the frequency of the filtered interference signal is tuned to $f_{ref}$ by using the phase-locked loop circuit, to tune f2 to the target frequency. For a second frequency difference detection apparatus, a target frequency of f3 is f1+F. If f3 has been tuned to the target frequency, a deviation between f3 and f1+$f_{RF}$ inevitably satisfies the following relationship: $|\Delta f2|=|(f1+F)-(f1+f_{RF})|=|F-f_{RF}|$. Likewise, the frequency of the reference signal needs to be set to $|F-f_{RF}|$. For a third frequency difference detection apparatus, a target frequency of f4 is f1+2$f_{RF}$. If f4 has been tuned to the target frequency, a deviation between f4 and f1+2$f_{RF}$ inevitably satisfies the following relationship: $|\Delta f3|=|(f1+2F)-(f1+2f_{RF})|=2*|F-f_{RF}|$. Likewise, the frequency of the reference signal needs to be set to $2*|F-f_{RF}|$.

If the value of F is close to a value of $2f_{RF}$, the frequency f2 of the second laser signal is set to be near f1-2$f_{RF}$, the frequency 3 of the third laser signal is set to be near f1+2$f_{RF}$, and the frequency f4 of the fourth laser signal is set to be near f1+4$f_{RF}$. For the first frequency difference detection apparatus, the target frequency of f2 is f1-F. If f2 has been tuned to the target frequency, a deviation between f2 and f1-2$f_{RF}$ inevitably satisfies the following relationship: $|\Delta f1|=|(f1-F)-(f1-2f_{RF})|=|2f_{RF}-F|$. Conversely, f2 can be tuned to the target frequency only when this relationship is satisfied. Therefore, the frequency $f_{ref}$ of the reference signal needs to be set to $|2f_{RF}-F|$, and the frequency of the filtered interference signal is tuned to $f_{ref}$ by using the phase-locked loop circuit, to tune f2 to the target frequency. For the second frequency difference detection apparatus, the target frequency of f3 is f1+F. If f3 has been tuned to the target frequency, a deviation between f3 and f1+2$f_{RF}$ inevitably satisfies the following relationship: $|\Delta f2|=|(f1+F)-(f1+2f_{RF})|=|F-2f_{RF}|$. The frequency of the filtered interference signal is tuned to $|F-2_{fR}R|$ by using the phase-locked loop circuit, to tune f3 to the target frequency. For the third frequency difference detection apparatus, the target frequency of f4 is f1+2F. If f4 has been tuned to the target frequency, a deviation between f4 and f1+4$f_{FR}$ inevitably satisfies the following relationship: $|\Delta f3|=|(f1+2F)-(f1+4f_{FR})|=2*|F-2f_{FR}|$. The frequency of the filtered interference signal is tuned to $2*|F-2f_{RF}|$ by using the phase-locked loop circuit, to tune f4 to the target frequency.

It should be understood that, in the laser signals output by the multi-wavelength laser, the target frequency spacings between the laser signals with the adjacent wavelengths may alternatively be different. For example, the second laser signal is located on the low frequency side of the first laser signal, and a target frequency spacing between the second laser signal and the first laser signal is F1, and a value of F1 is close to a value of $c*f_{RF}$; and the third laser signal is located on the high frequency side of the first laser signal, a frequency spacing between the third laser signal and the first laser signal is F2, and a value of F2 is close to a value of $d*f_{RF}$, where both c and d are positive integers. Therefore, $f_{ref}=|F1-c*f_{RF}|$ may be configured for the reference signal of the first frequency difference detection apparatus corresponding to the second laser signal, and $f_{ref}=|F2-d*f_{RF}|$ may be configured for the reference signal of the second frequency difference detection apparatus corresponding to the third laser signal.

Figure 8:
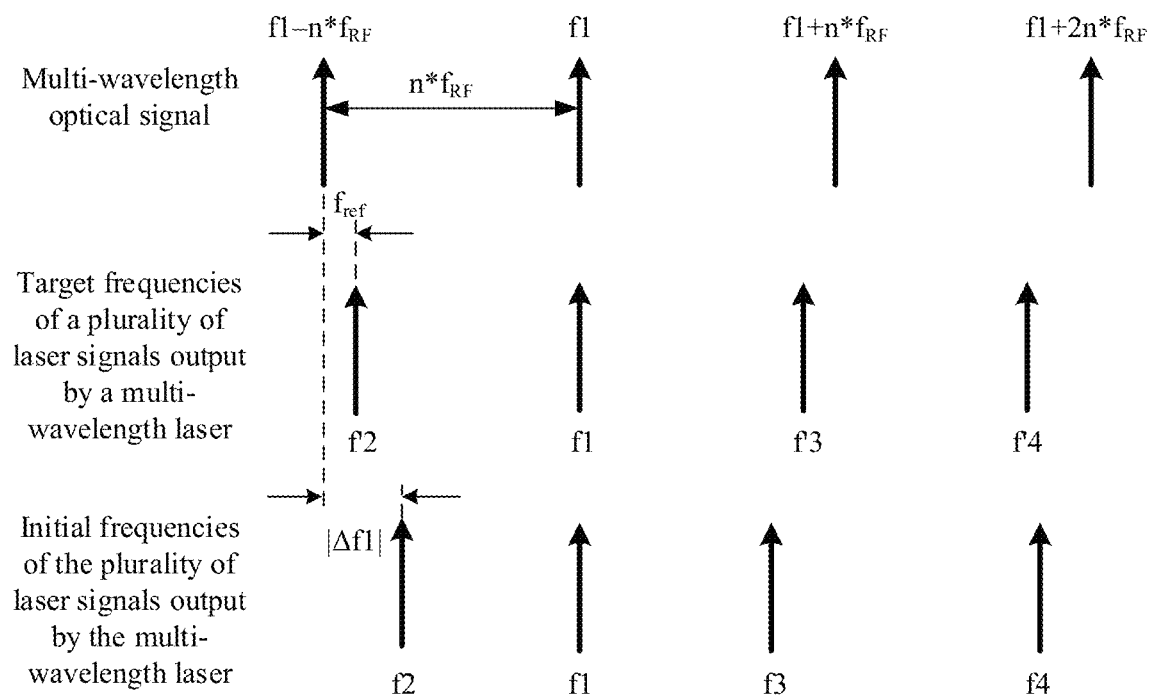
FIG. 8 is a diagram of a correspondence among a multi-wavelength optical signal, a target frequency of a multi-wavelength laser, and an initial frequency of the multi-wavelength laser.

Further, after a frequency of a reference signal of each frequency difference detection apparatus is set, tuning may be started. It is assumed that the target frequency spacing between the frequency f1 of the first laser signal and the frequency f2 of the second laser signal is F1, the value of F1 is the same as or close to a value of $n*f_{RF}$, and the frequency f2 of the second laser signal is set to be near f1-$n*f_{RF}$. The frequency of the filtered interference signal is a difference between the frequency f2 of the second laser signal and f1-$n*f_{RF}$, but a value relationship between f2 and f1-$n*f_{RF}$ cannot be determined. When the frequency of the filtered interference signal is tuned to the frequency $f_{ref}$ of the reference signal of the first frequency difference detection apparatus, two cases may occur: (f1-$n*f_{RF}$)-f2=$f_{ref}$ (a first case) and f2-(f1-$n*f_{RF}$)=$f_{ref}$ (a second case), and only one case satisfies a requirement. As shown in FIG. 8, the target frequency of f2 is f1-$n*f_{RF}$+$f_{ref}$. Therefore, the second case satisfies the requirement. In the first case, f2 is tuned to f1-$n*f_{RF}$-$f_{ref}$, and the requirement cannot be satisfied.

To resolve the foregoing problem, this embodiment of this application proposes the following solution: enabling an initial frequency f2 of the second laser signal output by the second wavelength-tunable laser to satisfy a specific condition. If f1-F1 is greater than f1-$n*f_{RF}$, f2 is initially set to be on a high frequency side of f1-$n*f_{RF}$, in other words, f2>f1-$n*f_{RF}$, and the frequency difference between f2 and f1-$n*f_{RF}$ is less than a frequency difference between f2 and f1+$k*f_{RF}$ (k≠n). Considering precision of the wavelength-tunable laser, and assuming that the precision is ±Δf, a set value of f2 may be greater than a value of f1-$n*f_{RF}$+Δf. In this way, even if an output wavelength of the wavelength-tunable laser has a deviation, an actual value of f2 is not less than f1-$n*f_{RF}$.

If f1-F1 is less than f1-$n*f_{RF}$, f2 is initially set to be on a low frequency side of f1-$n*f_{RF}$, in other words, f2 needs to be less than a value of f1-$n*f_{RF}$, and the frequency difference between f2 and f1-$n*f_{RF}$ is less than the frequency difference between f2 and f1+$k*f_{RF}$ (k≠n). Considering the precision of the wavelength-tunable laser, the set value of f2 may be less than a value of f1-$n*f_{RF}$-Δf. If f1-F1=f1-$n*f_{RF}$, the frequency difference between f2 and f1-$n*f_{RF}$ needs to be less than the frequency difference between f2 and f1+$k*f_{RF}$ (k≠n).

If the initially set value of f2 satisfies the foregoing condition, the following problem can be avoided: f2 is tuned to an incorrect frequency because a value of the optical signal obtained through interference is a positive number and the value relationship between f2 and f1−n*$f_{RF}$ cannot be determined. A frequency of another laser signal may also be set in the same manner. Details are not described in this embodiment of this application again. It should be noted that, in any embodiment of this application, a frequency of a laser signal can be initially set by using this solution.

Optionally, the frequency difference detector further includes a first frequency divider 704 and a second frequency divider 705, as shown in FIG. 7. The first frequency divider 704 is configured to: receive the filtered interference signal, perform frequency division on the filtered interference signal to obtain a low-frequency interference signal, and send the low-frequency interference signal to the phase-locked loop circuit 701. The second frequency divider 705 is configured to: receive the reference signal, perform frequency division on the reference signal to obtain a low-frequency reference signal, and send the low-frequency reference signal to the phase-locked loop circuit 701. The phase-locked loop circuit 701 is configured to: detect a frequency difference between the low-frequency interference signal and the low-frequency reference signal to obtain the frequency difference signal, and send the frequency difference signal to the loop filter 702. The loop filter 702 adds a loop gain to the frequency difference signal and filters the frequency difference signal, and then sends an obtained frequency difference signal to the controller 703. The controller 703 tunes a wavelength of a laser signal output by a corresponding wavelength-tunable laser until a frequency of the low-frequency interference signal is the same as a frequency of the low-frequency reference signal.

It is assumed that a frequency division ratio of the first frequency divider is N, the frequency of the low-frequency interference signal is 1/N of a frequency before frequency division, a frequency division ratio of the second frequency divider is M, and the frequency of the low-frequency reference signal is 1/M of a frequency before frequency division. If a value of a target frequency spacing Fn between a laser signal and the first laser signal is close to the value of n*$f_{RF}$, a frequency of a reference signal of a frequency difference detection apparatus corresponding to the laser signal satisfies the following relationship: $f_{ref}$=(M/N)*|Fn−n*$f_{FR}$|, where n is a positive integer, and values of N and M may be the same or different, and are both greater than 1.

The first frequency difference detection apparatus is used as an example. It is assumed that the target frequency spacing between the frequency f2 of the second laser signal and the frequency f1 of the first laser signal is F, and the target frequency of f2 is f1−F. If the value of F is close to $f_{RF}$, and f2 has been tuned to the target frequency, the deviation between f2 and f1−$f_{RF}$ inevitably stratifies the following relationship: Δf1|=|(f1−F)−(f1−$f_{FR}$)|=|$f_{FR}$−F|. N-multiple frequency division and M-multiple frequency division are performed on the filtered interference signal and the reference signal respectively. Therefore, the frequency $f_{ref}$ of the reference signal needs to be set to (M/N)*|$f_{FR}$-F|, and the frequency of the low-frequency interference signal is tuned to $f_{ref}$ by using the phase-locked loop circuit, to tune f2 to the target frequency. The two frequency dividers are used to reduce the frequency of the filtered interference signal and the frequency of the reference signal respectively. This can reduce a bandwidth requirement for the phase-locked loop circuit, and therefore implementation is easier. The frequency division ratios of the two frequency dividers may be the same or different. This is not limited in this embodiment of this application.

Optionally, the frequency difference detector may alternatively include only one frequency divider. For example, only a first frequency divider is included, and in this case, the frequency $f_{ref}$ of the reference signal is set to (1/N)*|$f_{RF}$−F|. Alternatively, only a second frequency divider is included, and in this case, the frequency $f_{ref}$ of the reference signal is set to M*|$f_{RF}$−F|.

Figure 9:
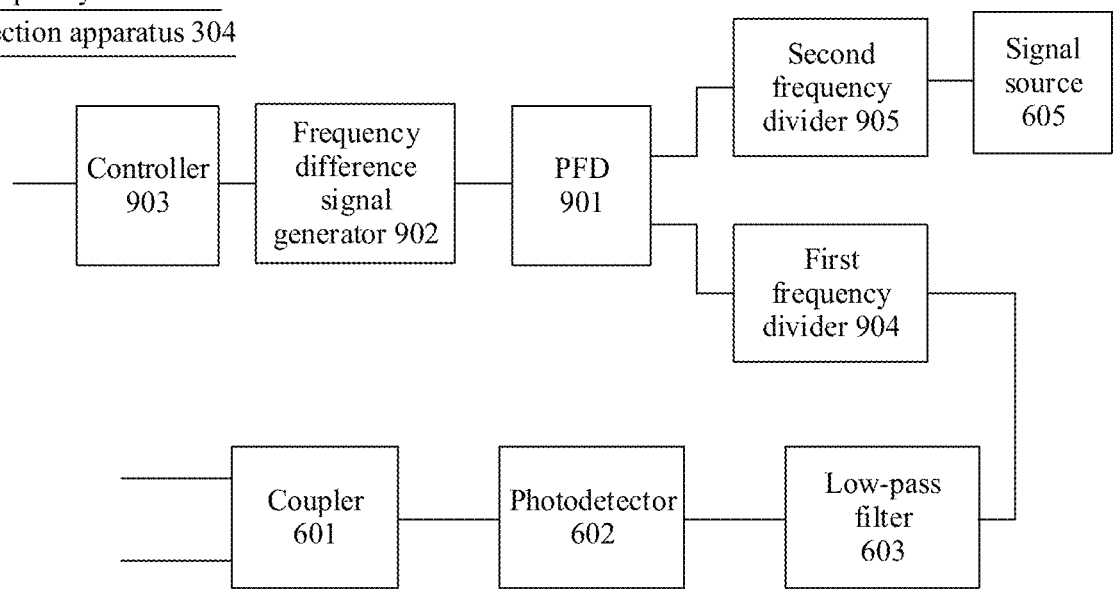
FIG. 9 is a structural diagram of a frequency difference detector in a frequency difference detection apparatus according to another embodiment of this application.

Optionally, in another embodiment of this application, the frequency difference detection apparatus 304 may include a phase-frequency detector (PFD) 901, a frequency difference signal generator 902, and a controller 903, as shown in FIG. 9. The PFD 901 is configured to: receive a filtered interference signal and the reference signal, detect a frequency difference between the filtered interference signal and the reference signal, and send a detected signal to the frequency difference signal generator 902. The frequency difference signal generator 902 is configured to: generate a frequency difference signal based on the detected signal, and send the frequency difference signal to the controller 903. The controller 903 is configured to: generate a control signal based on the frequency difference signal, and send the control signal.

Further, the frequency difference signal generator 902 includes a low-pass filter, a subtractor, and a loop filter. The low-pass filter is configured to: receive the signal from the PFD 901, perform low-pass filtering on the signal, and send a filtered signal to the subtractor. The subtractor is configured to: subtract a preset voltage reference signal from the filtered signal to obtain the frequency difference signal, and send the frequency difference signal to the loop filter. The loop filter is configured to: add a loop gain to the frequency difference signal and filter the frequency difference signal, and then send an obtained frequency difference signal to the controller 903.

In this embodiment, the frequency difference detection apparatus 304 further includes a first frequency divider 904 and a second frequency divider 905. The first frequency divider 904 is configured to: receive the filtered interference signal, perform frequency division on the filtered interference signal to obtain a low-frequency interference signal, and send the low-frequency interference signal to the PFD 901. The second frequency divider 905 is configured to: receive the reference signal, perform frequency division on the reference signal to obtain a low-frequency reference signal, and send the low-frequency reference signal to the PFD 901. The PFD 901 is configured to: receive the low-frequency interference signal and the low-frequency reference signal, detect a frequency difference between the low-frequency interference signal and the low-frequency reference signal, and send a detected signal to the frequency difference signal generator 902. A specific function of the frequency difference detection apparatus has been described in detail in the foregoing embodiment. Details are not described in this embodiment of this application again.

It should be noted that the beam splitter, the coupler, the phase modulator, the power splitter, and the photodetector in the foregoing embodiments are all polarization-dependent devices, and may be implemented by using an integrated optical circuit or spatial optics. Alternatively, the foregoing devices may be discrete devices, and a connection between the devices may be implemented by using a polarization-maintaining optical fiber. Certainly, the foregoing devices may alternatively be partially integrated and partially discrete. This is not specifically limited in this embodiment of this application.

Figure 10:
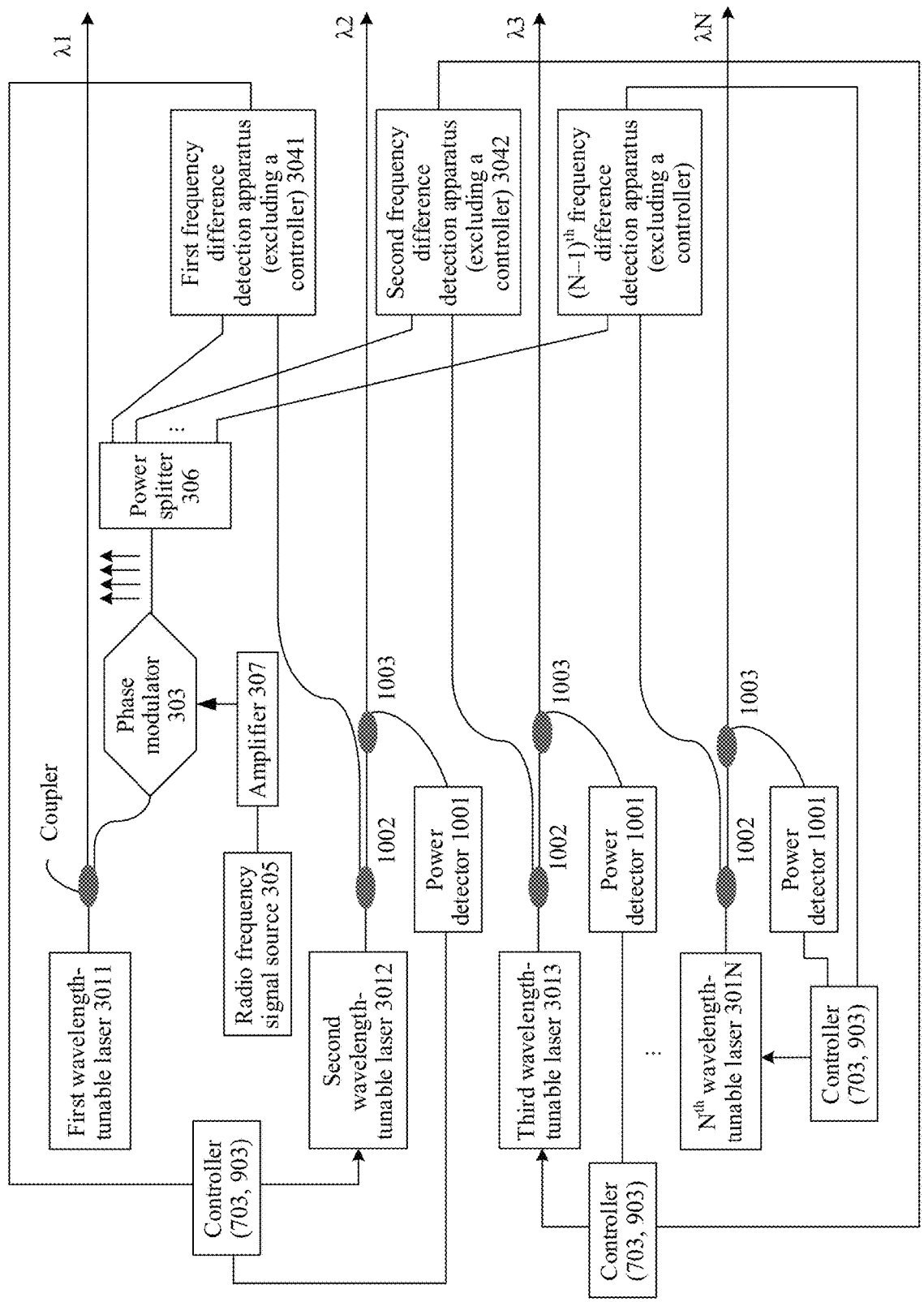
FIG. 10 is a structural diagram of a multi-wavelength laser according to another embodiment of this application.

Another embodiment of this application provides a multi-wavelength laser. As shown in FIG. 10, the multi-wavelength laser further includes N−1 power detectors 1001 in addition to the devices of the multi-wavelength laser shown in FIG. 3. Another beam splitter 302 excluding a first beam splitter includes two cascaded couplers (1002, 1003). The coupler 1002 is configured to: split a received laser signal into two laser signals, and send one laser signal to the coupler 1003 and the other laser signal to a frequency difference detection apparatus 304; and the coupler 1003 is configured to: split the received laser signal into two laser signals, send one laser signal to the power detector 1001, and use the other laser signal as an output signal of the multi-wavelength laser. Alternatively, the coupler 1002 is configured to: split a received laser signal into two laser signals, and send one laser signal to the coupler 1003 and the other laser signal to the power detector 1001; and the coupler 1003 is configured to: split the received laser signal into two laser signals, send one laser signal to a frequency difference detection apparatus 304, and use the other laser signal as an output signal of the multi-wavelength laser. It should be noted that the another beam splitter 302 may alternatively be implemented by using a beam splitter including at least three output ports, to spit the received laser signal into at least three laser signals, where one laser signal is sent to the frequency difference detection apparatus 304, one laser signal is sent to the power detector 1001, and the remaining laser signal is used as the output signal of the multi-wavelength laser.

The power detector 1001 is configured to: measure power of a laser signal emitted by a corresponding wavelength-tunable laser, and send a power value to a controller (703, 903). In this way, the controller can better control output features such as output power of the corresponding wavelength-tunable laser.

Figure 11:
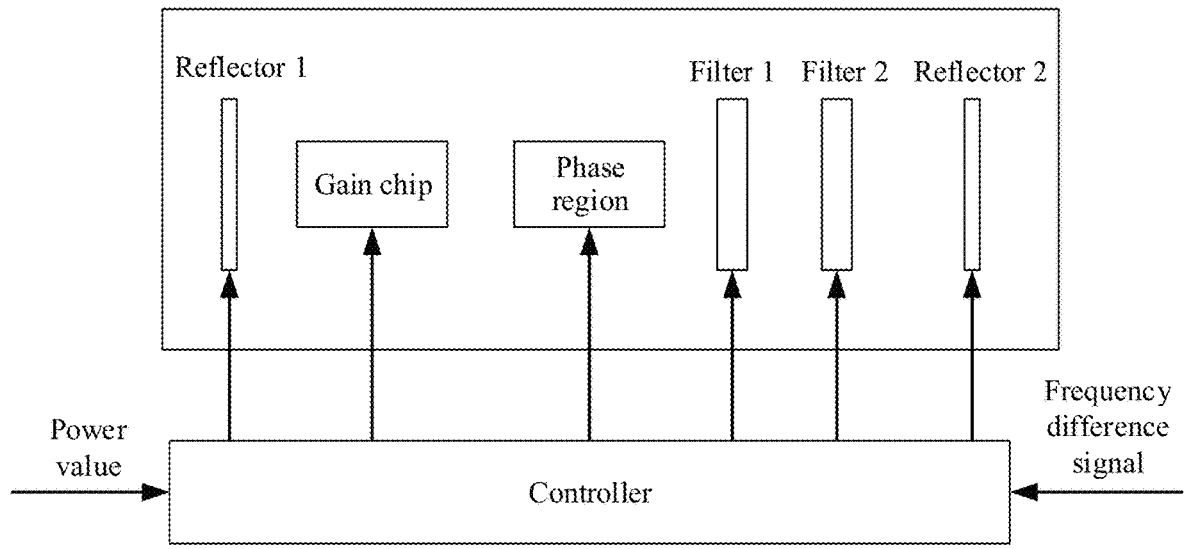
FIG. 11 is a structural diagram of a wavelength-tunable laser.

Specifically, the wavelength-tunable laser may be a distributed Bragg reflector (DBR) laser, an external cavity laser, or the like. In this embodiment, a structure of a wavelength-tunable laser shown in FIG. 11 is used as an example to describe an effect of the power value on control over the output power of the wavelength-tunable laser. As shown in FIG. 11, the wavelength-tunable laser includes a reflector 1, a reflector 2, a gain chip, a phase region, a filter 1, and a filter 2. The two reflectors are configured to implement feedback of a resonant cavity of the laser. Optionally, positions of the two reflectors may be fine-tuned by using a piezoelectric ceramic transformer (PZT), and a drive signal is provided by the controller (703, 903). The reflector 1 may also be implemented by plating a reflecting film on one side of the gain chip. The gain chip is configured to generate and amplify light. The phase region is configured to fine-tune a frequency of the laser. The filter 1 and the filter 2 each have a periodic filtering spectrum, to jointly tune a wavelength of the laser to obtain a wavelength range covering a C band.

Frequency precision of a current commercial wavelength-tunable laser is about 1.5 GHz. Therefore, when a frequency of the laser signal output by the wavelength-tunable laser is tuned by using a control signal, an output frequency of the wavelength-tunable laser may significantly deviate from centers of the filtering spectrums of the filter 1 and the filter 2. As a result, performance of the laser deteriorates. Therefore, the multi-wavelength laser may further include a dithering signal source. A generated dithering signal is loaded onto the reflector 1 and/or the reflector 2. Output optical power of the wavelength-tunable laser also generates dithering of a same frequency, and the dithering optical power may be obtained by using the power detector and sent to the controller for processing. The controller determines a position of a center of a total filtering spectrum of the filter 1 and the filter 2 relative to the output frequency of the laser, and separately feeds back and tunes the filtering spectrums of the filter 1 and the filter 2, to ensure that an output frequency of each of N−1 wavelength-tunable lasers is dynamically aligned with a center wavelength of a total filtering spectrum of two filters of the wavelength-tunable laser. This can ensure that performance such as power and an SMSR of the wavelength-tunable laser does not deteriorate obviously.

Optionally, the dithering signal may further be loaded onto the filter 1 and/or the filter 2. In this case, the output optical power of the wavelength-tunable laser also fluctuates at a frequency the same as a frequency of the dithering signal loaded onto the filter, and the dithering optical power may be obtained by using the power detector and sent to the controller for processing. The controller determines positions of the centers of the filtering spectrums of the filter 1 and the filter 2 relative to an output wavelength of the wavelength-tunable laser, and separately feeds back and tunes the filtering spectrums of the filter 1 and the filter 2, to ensure that an output wavelength of each of the N−1 wavelength-tunable lasers is dynamically aligned with center wavelengths of filtering spectrums of filters of the wavelength-tunable laser.

It should be understood that this embodiment of this application is described by using an example in which the wavelength-tunable laser includes two filters, and the wavelength-tunable laser may alternatively include another quantity of filters. For example, the wavelength-tunable laser may include one filter, three filters, or the like, and a principle is not changed.

Figure 12:
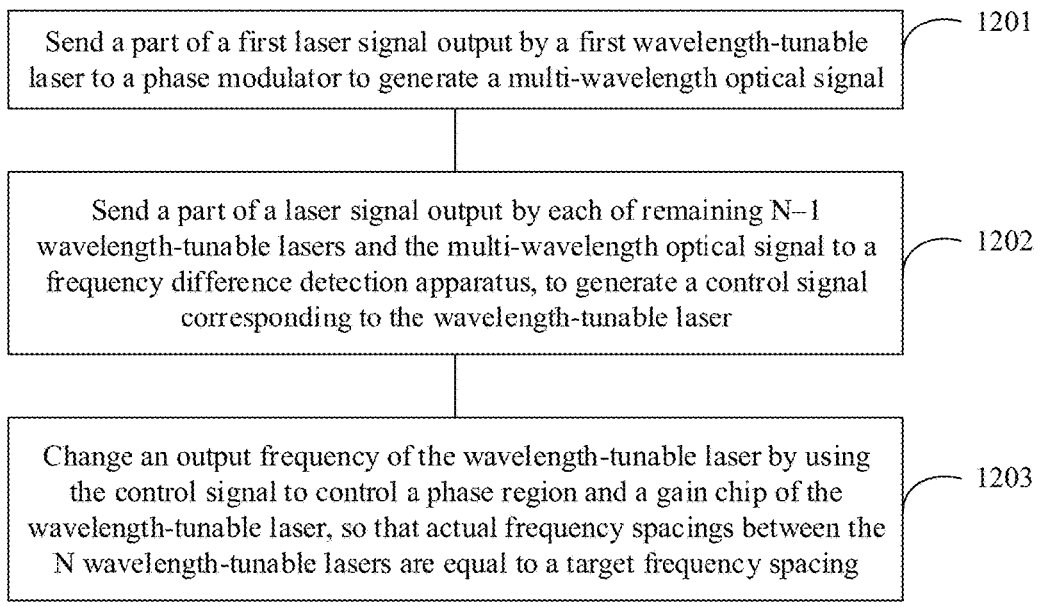
FIG. 12 is a flowchart of a frequency control method for a multi-wavelength laser according to another embodiment of this application.

Another embodiment of this application describes a frequency control method for a multi-wavelength laser. As shown in FIG. 12, the method is applicable to the multi-wavelength lasers shown in FIG. 3, FIG. 4, FIG. 6, and FIG. 8 to FIG. 10.

1201: Send a part of a first laser signal output by a first wavelength-tunable laser to a phase modulator to generate a multi-wavelength optical signal, where a center frequency of the multi-wavelength optical signal is an output frequency f1 of the first wavelength-tunable laser, and a frequency spacing of the multi-wavelength optical signal is a frequency $f_{RF}$ of a drive signal of the phase modulator. The other part of the first layer signal is used as an output signal of the multi-wavelength laser. A center frequency of each subcarrier in the multi-wavelength optical signal is $f1+k*f_{RF}$, where k is an integer. If k is a negative value, it indicates that the subcarrier is located on a low frequency side of f1; or if k is a positive value, it indicates that the subcarrier is located on a high frequency side of f1.

1202: Send a part of a laser signal output by each of remaining N−1 wavelength-tunable lasers and the multi-wavelength optical signal to a frequency difference detection apparatus, to generate a control signal corresponding to the wavelength-tunable laser. The other part of the laser signal output by each of the N−1 wavelength-tunable lasers is an output signal of the multi-wavelength laser. A process in which the frequency difference detection apparatus generates the control signal based on the laser signal and the multi-wavelength optical signal is described in detail in the foregoing apparatus embodiment, and details are not described in this embodiment again.

Specifically, before the remaining N−1 wavelength-tunable lasers work, an output frequency needs to be initially set, and a difference between a set value and a frequency of a corresponding subcarrier in the multi-wavelength optical signal is less than a difference between the set value and a frequency of another subcarrier in the multi-wavelength optical signal. Further, the set value is determined based on a value relationship between a target frequency of the wavelength-tunable laser and the frequency of the corresponding subcarrier. A specific relationship is as follows:

It is assumed that the frequency of the first wavelength-tunable laser is f1, a frequency that is of a wavelength-tunable laser and that needs to be initially set is f2, a target frequency of f2 is f1−F, and a frequency of a corresponding subcarrier is f1−$f_{RF}$. If f1−F is greater than f1−$f_{RF}$, f2 is initially set to be on a high frequency side of f1−$f_{RF}$, in other words, f2>f1−$f_{RF}$, and a frequency difference between f2 and f1−$f_{RF}$ is less than a frequency difference between f2 and f1+k*$f_{RF}$ (k≠−1). Considering precision of the wavelength-tunable laser, and assuming that the precision is ±Δf, a set value of f2 may be greater than a value of f1−$f_{RF}$+Δf. In this way, even if an output wavelength of the wavelength-tunable laser has a deviation, an actual value of f2 is not less than f1−$f_{RF}$.

If f1−F1 is less than f1−Fu, f2 is initially set to be on a low frequency side of f1−$f_{RF}$, in other words, f2 needs to be less than a value of f1−$f_{RF}$, and the frequency difference between f2 and f1−$f_{RF}$ is less than the frequency difference between f2 and f1+k*$f_{RF}$ (k≠−1). Considering the precision of the wavelength-tunable laser, the set value of f2 may be less than a value of f1−$f_{RF}$−Δf.

If f1−F1=f1−$f_{RF}$, the frequency difference between f2 and f1−$f_{RF}$ needs to be less than the frequency difference between f2 and f1+k*$f_{RF}$ (k≠−1).

1203: Change the output frequency of the wavelength-tunable laser by using the control signal to control a phase region and a gain chip of the wavelength-tunable laser, so that actual frequency spacings between the N wavelength-tunable lasers are equal to a target frequency spacing. The phase region is configured to compensate for a slow and large-amplitude frequency change. The gain chip is configured to compensate for a fast and small-amplitude frequency change.

Optionally, in the wavelength-tunable laser, a temperature control unit may be used to replace the phase region. Therefore, the output frequency of the wavelength-tunable laser may alternatively be changed by using the control signal to control the temperature control unit and the gain chip of the wavelength-tunable laser, so that the actual frequency spacings between the N wavelength-tunable lasers are equal to the target frequency spacing. The temperature control unit tunes the output frequency of the laser by changing an operating temperature of the laser, and may be configured to compensate for the slow and large-amplitude frequency change.

Further, it can be understood that an electrical signal processing part in the embodiments of this application may be partially or completely implemented by a processor. The electrical signal processing part is apart between the low-pass filter and the controller. The processor in the embodiments of this application may be a central processing unit (CPU), or may be another general-purpose processor, a digital signal processor (DSP), an application-specific integrated circuit (ASIC), a field-programmable gate array (FPGA) or another programmable logic device, a discrete gate or transistor logic device, a discrete hardware component, or the like. The general-purpose processor may be a microprocessor, or the processor may be any conventional processor or the like.

In the several embodiments provided in this application, it should be understood that the disclosed apparatus and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electrical, mechanical, or other forms.

The foregoing descriptions are merely example embodiments of the technical solutions of the present invention, but are not intended to limit the protection scope of the present invention. Any modification, equivalent replacement, or improvement made without departing from the spirit and principle of the present invention shall fall within the protection scope of the present invention.

What is claimed is:

1. A multi-wavelength laser comprising: N wavelength-tunable lasers, N beam splitters, a phase modulator, and N−1 frequency difference detection apparatuses, wherein N is a positive integer not less than 2;
    a first wavelength-tunable laser is configured to: generate a first laser signal, and send the first laser signal to a first beam splitter in the N beam splitters, wherein the N wavelength-tunable lasers comprise the first wavelength-tunable laser;
    the first beam splitter is configured to: split the first laser signal into at least two beams of first laser signals, and send a first beam of the first laser signal to the phase modulator, wherein a second beam of the first laser signal is an output signal of the multi-wavelength laser;
    the phase modulator is configured to: modulate the first beam of the first laser signal to generate a multi-wavelength optical signal, and send the multi-wavelength optical signal to a first frequency difference detection apparatus, wherein the N−1 frequency difference detection apparatuses comprise the first frequency difference detection apparatus, and frequency spacings between adjacent wavelengths in the multi-wavelength optical signal are the same;
    a second wavelength-tunable laser is configured to: generate a second laser signal, and send the second laser signal to a second beam splitter in the N beam splitters, wherein the N wavelength-tunable lasers comprise the second wavelength-tunable laser;
    the second beam splitter is configured to: split the second laser signal into at least two beams of second laser signals, and send a first beam of the second laser signal to the first frequency difference detection apparatus, wherein a second beam of the second laser signal is another output signal of the multi-wavelength laser; and
    the first frequency difference detection apparatus is configured to: obtain a first control signal based on the multi-wavelength optical signal and the first beam of the second laser signal, and send the first control signal to the second wavelength-tunable laser, wherein the first control signal is used to tune an output wavelength of the second wavelength-tunable laser.

2. The multi-wavelength laser according to claim 1, wherein in response to N being greater than 2, the multi-wavelength laser further comprises a power splitter;

the phase modulator is configured to send the multi-wavelength optical signal to the power splitter;

the power splitter splits the multi-wavelength optical signal into at least N−1 multi-wavelength optical signals, sends a first multi-wavelength optical signal to the first frequency difference detection apparatus, and sends a second multi-wavelength optical signal to a second frequency difference detection apparatus, wherein the N−1 frequency difference detection apparatuses comprise the second frequency difference detection apparatus;

a third wavelength-tunable laser is configured to: generate a third laser signal, and send the third laser signal to a third beam splitter in the N beam splitters, wherein the N wavelength-tunable lasers comprise the third wavelength-tunable laser;

the third beam splitter is configured to: split the third laser signal into at least two beams of third laser signals, and send a first beam of third laser signal to the second frequency difference detection apparatus, wherein a second beam of third laser signal is an output signal of the multi-wavelength laser; and the second frequency difference detection apparatus is configured to: obtain a second control signal based on the second multi-wavelength optical signal and the first beam of third laser signal, and send the second control signal to the third wavelength-tunable laser, wherein the second control signal is used to tune an output wavelength of the third wavelength-tunable laser.

3. The multi-wavelength laser according to claim 1, wherein the multi-wavelength laser further comprises a radio frequency signal source;

the radio frequency signal source is configured to: generate a radio frequency signal, and send the radio frequency signal to the phase modulator; and the phase modulator is configured to modulate the first beam of first laser signal based on the radio frequency signal to generate the multi-wavelength optical signal, wherein the frequency spacings between the adjacent wavelengths in the multi-wavelength optical signal are related to a frequency of the radio frequency signal.

4. The multi-wavelength laser according to of claim 1, wherein
if a difference between a target frequency of a secondary wavelength-tunable laser and a frequency of a corresponding subcarrier in the multi-wavelength optical signal is less than a difference between the target frequency and a frequency of another subcarrier in the multi-wavelength optical signal, a difference between an initial frequency of the secondary wavelength-tunable laser and the frequency of the corresponding subcarrier is less than a difference between the initial frequency of the secondary wavelength-tunable laser and the frequency of the another subcarrier, wherein the secondary wavelength-tunable laser is any one of the N wavelength-tunable lasers except the first wavelength-tunable laser.

5. The multi-wavelength laser according to claim 4, wherein if the target frequency of the secondary wavelength-tunable laser is greater than the frequency of the corresponding subcarrier, the initial frequency configured for the secondary wavelength-tunable laser is greater than the frequency of the corresponding subcarrier; or if the target frequency of the secondary wavelength-tunable laser is less than the frequency of the corresponding subcarrier, the initial frequency configured for the secondary wavelength-tunable laser is less than the frequency of the corresponding subcarrier.

6. The multi-wavelength laser according to claim 4, wherein if the target frequency of the secondary wavelength-tunable laser is greater than the frequency of the corresponding subcarrier, a frequency obtained by subtracting a maximum frequency error value of the secondary wavelength-tunable laser from the initial frequency configured for the secondary wavelength-tunable laser is greater than the frequency of the corresponding subcarrier; or if the target frequency of the secondary wavelength-tunable laser is less than the frequency of the corresponding subcarrier, a frequency obtained by adding a maximum frequency error value of the secondary wavelength-tunable laser and the initial frequency configured for the secondary wavelength-tunable laser is less than the frequency of the corresponding subcarrier.

7. The multi-wavelength laser according to claim 1, wherein the frequency difference detection apparatus comprises a coupler, a photodetector, a low-pass filter, a frequency difference detector, and a signal source;

the coupler is configured to: receive the multi-wavelength optical signal and a laser signal, perform interference on the multi-wavelength optical signal and the laser signal, and send an optical signal obtained through interference to the photodetector;

the photodetector is configured to: perform optical-to-electrical conversion on the optical signal obtained through interference, and send a converted interference signal to the low-pass filter;

the low-pass filter is configured to: perform low-pass filtering on the converted interference signal, and send a filtered interference signal to the frequency difference detector;

the signal source is configured to: generate a reference signal, and send the reference signal to the frequency difference detector; and the frequency difference detector is configured to: detect a frequency difference between the filtered interference signal and the reference signal to obtain a control signal, and send the control signal.

8. The multi-wavelength laser according to claim 7, wherein the frequency difference detector comprises a phase-locked loop circuit, a loop filter, and a controller;

the phase-locked loop circuit is configured to: obtain the reference signal, detect the frequency difference between the filtered interference signal and the reference signal to obtain a frequency difference signal, and send the frequency difference signal to the loop filter;

the loop filter is configured to: add a loop gain to the frequency difference signal and filter the frequency difference signal, and then send an obtained frequency difference signal to the controller; and the controller is configured to: generate the control signal based on the received signal, and send the control signal.

9. The multi-wavelength laser according to claim 8, wherein a frequency of the reference signal is the difference between the target frequency of the secondary wavelength-tunable laser and the frequency of the corresponding subcarrier in the multi-wavelength optical signal, wherein the difference between the target frequency and the frequency of the corresponding subcarrier is less than the difference between the target frequency and the frequency of the another subcarrier in the multi-wavelength optical signal.

10. The multi-wavelength laser according to claim 8, wherein the frequency difference detector further comprises a first frequency divider and a second frequency divider;
- the first frequency divider is configured to: receive the filtered interference signal, perform frequency division on the filtered interference signal to obtain a low-frequency interference signal, and send the low-frequency interference signal to the phase-locked loop circuit;
- the second frequency divider is configured to: receive the reference signal, perform frequency division on the reference signal to obtain a low-frequency reference signal, and send the low-frequency reference signal to the phase-locked loop circuit; and
- the phase-locked loop circuit is configured to: detect a frequency difference between the low-frequency interference signal and the low-frequency reference signal to obtain the frequency difference signal, and send the frequency difference signal to the loop filter.

11. The multi-wavelength laser according to claim 10, wherein a frequency of the reference signal is M/N of the difference between the target frequency of the secondary wavelength-tunable laser and the frequency of the corresponding subcarrier in the multi-wavelength optical signal, wherein N and M are a frequency division ratio of the first frequency divider and a frequency division ratio of the second frequency divider respectively, and are both greater than 1, and the difference between the target frequency and the frequency of the corresponding subcarrier is less than the difference between the target frequency and the frequency of the another subcarrier in the multi-wavelength optical signal.

12. The multi-wavelength laser according to claim 7, wherein the frequency difference detector comprises a phase-frequency detector (PFD), a low-pass filter, a subtractor, a loop filter, and a controller;
- the PFD is configured to: receive the filtered interference signal and the reference signal, generate a signal related to the frequency difference, and send the signal to the low-pass filter;
- the low-pass filter is configured to: perform low-pass filtering on the received signal, and send a filtered signal to the subtractor;
- the subtractor is configured to: subtract a preset voltage reference signal from the filtered signal to obtain a frequency difference signal, and send the frequency difference signal to the loop filter;
- the loop filter is configured to: add a loop gain to the frequency difference signal and filter the frequency difference signal, and then send an obtained frequency difference signal to the controller; and
- the controller is configured to: generate the control signal based on the received signal, and send the control signal.

13. The multi-wavelength laser according to claim 8, wherein the multi-wavelength laser further comprises: N−1 power detectors, wherein the N−1 power detectors one-to-one correspond to N−1 secondary wavelength-tunable lasers, and the secondary wavelength-tunable laser is any one of the N wavelength-tunable lasers except the first wavelength-tunable laser; and
- a secondary beam splitter, configured to: split a received laser signal into at least three beams of laser signals, send a beam of laser signal to a corresponding frequency difference detection apparatus, send another beam of laser signal to a power detector, and use a third beam of laser signal as an output signal of the multi-wavelength laser, wherein the secondary beam splitter is any one of the N beam splitters except the beam splitter connected to the first wavelength-tunable laser; wherein
- the power detector is configured to: measure power of a laser signal emitted by a corresponding secondary wavelength-tunable laser, and send a power value to the controller.

14. The multi-wavelength laser according to claim 1, wherein the N beam splitters, the phase modulator, and the power splitter are all polarization-maintaining devices, and a connection between a wavelength-tunable laser and a corresponding frequency difference detection apparatus is one or more of a polarization-maintaining optical fiber, an optical waveguide, and spatial light.

15. A frequency control method for a multi-wavelength laser, wherein the multi-wavelength laser comprises N wavelength-tunable lasers, N beam splitters, a phase modulator, and N−1 frequency difference detection apparatuses, and the N wavelength-tunable lasers comprise a reference wavelength-tunable laser and N−1 secondary wavelength-tunable lasers; the reference wavelength-tunable laser is connected to one beam splitter, the beam splitter comprises a first output port and a second output port, the first output port is used as an output port of the multi-wavelength laser, and the second output port is connected to the phase modulator; the phase modulator is separately connected to the N−1 frequency difference detection apparatuses; the N−1 secondary wavelength-tunable lasers one-to-one correspond to remaining N−1 beam splitters and the N−1 frequency difference detection apparatuses; the secondary wavelength-tunable laser is connected to a corresponding beam splitter, and the corresponding beam splitter comprises a third output port and a fourth output port; the third output port is used as an output port of the multi-wavelength laser, and the fourth output port is connected to a corresponding frequency difference detection apparatus; N is a positive integer not less than 2; and the frequency control method comprises:
- sending a part of a first laser signal output by a first wavelength-tunable laser to the phase modulator to generate a multi-wavelength optical signal, wherein a center frequency of the multi-wavelength optical signal is an output frequency of the first wavelength-tunable laser, and a frequency spacing of the multi-wavelength optical signal is a frequency of a drive signal of the phase modulator;
- sending a beam part of a laser signal output by the secondary wavelength-tunable laser and the multi-wavelength optical signal to the frequency difference detection apparatus to generate a control signal, wherein the control signal is based on the multi-wavelength optical signal and the beam part of the laser signal output by the secondary wavelength-tunable laser, and
- tuning an output frequency of the wavelength-tunable laser by using the control signal.

16. The frequency control method according to claim 15, wherein a difference between a target frequency of the secondary wavelength-tunable laser and a frequency of a corresponding subcarrier in the multi-wavelength optical signal is less than a difference between the target frequency and a frequency of another subcarrier in the multi-wavelength optical signal, and a difference between an initial frequency configured for the secondary wavelength-tunable laser and the frequency of the corresponding subcarrier is less than a difference between the initial frequency and the frequency of the another subcarrier in the multi-wavelength optical signal.

17. The frequency control method according to claim 16, wherein
if the target frequency of the secondary wavelength-tunable laser is greater than the frequency of the corresponding subcarrier, the initial frequency configured for the secondary wavelength-tunable laser is greater than the frequency of the corresponding subcarrier; or
if the target frequency of the secondary wavelength-tunable laser is less than the frequency of the corresponding subcarrier, the initial frequency configured for the secondary wavelength-tunable laser is less than the frequency of the corresponding subcarrier.

18. The frequency control method according to claim 16, wherein
if the target frequency of the secondary wavelength-tunable laser is greater than the frequency of the corresponding subcarrier, a frequency obtained by subtracting a maximum frequency error value of the secondary wavelength-tunable laser from the initial frequency configured for the secondary wavelength-tunable laser is greater than the frequency of the corresponding subcarrier; or
if the target frequency of the secondary wavelength-tunable laser is less than the frequency of the corresponding subcarrier, a frequency obtained by adding a maximum frequency error value of the secondary wavelength-tunable laser and the initial frequency configured for the secondary wavelength-tunable laser is less than the frequency of the corresponding subcarrier.

19. The frequency control method according to claim 15, wherein the wavelength-tunable laser comprises a first reflector, a second reflector, a gain chip, a phase region, and a filter; and the method further comprises:
loading a dithering signal onto any one or more of the first reflector, the second reflector, and the filter;
detecting output power of the wavelength-tunable laser, and obtaining, based on a detected power value, a position of a center frequency of a filtering spectrum of the filter relative to the output frequency of the wavelength-tunable laser; and
tuning the center frequency of the filtering spectrum of the filter based on the relative position.

20. The frequency control method according to claim 15, wherein the N beam splitters and the phase modulator are polarization-maintaining devices, and a connection between a wavelength-tunable laser and a corresponding frequency difference detection apparatus is one or more of a polarization-maintaining optical fiber, an optical waveguide, and spatial light.

* * * * *